United States Patent [19]
Sato et al.

[11] Patent Number: 6,022,806
[45] Date of Patent: *Feb. 8, 2000

[54] METHOD OF FORMING A FILM IN RECESS BY VAPOR PHASE GROWTH

[75] Inventors: Yuusuke Sato; Naoki Tamaoki; Toshimitu Ohmine, all of Tokyo, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/401,904

[22] Filed: Mar. 10, 1995

[30] Foreign Application Priority Data

Mar. 15, 1994 [JP] Japan ................... 6-044027

[51] Int. Cl.$^7$ ................... H01L 21/00; C23C 16/00
[52] U.S. Cl. ................... 438/684; 438/782; 427/240; 427/255.5
[58] Field of Search ................... 437/231, 233; 427/72, 240, 255.5

[56] References Cited

U.S. PATENT DOCUMENTS

| | | | |
|---|---|---|---|
| Re. 33,321 | 9/1990 | Magarino et al. | 350/333 |
| 4,599,135 | 7/1986 | Tsunekawa et al. | 156/643 |
| 5,356,476 | 10/1994 | Foster et al. | 118/725 |
| 5,441,594 | 8/1995 | Zenke | 156/643.1 |
| 5,576,059 | 1/1993 | Beinglass et al. | 427/255 |
| 5,670,210 | 9/1997 | Mandal et al. | 427/240 |

FOREIGN PATENT DOCUMENTS

| | | |
|---|---|---|
| 5-90167 | 4/1993 | Japan . |
| 5-90168 | 4/1993 | Japan . |

OTHER PUBLICATIONS

Wolf, Stanley, *Silicon Processing for the VLSI ERA*, vol. 1, pp. 177–180, 1986.
Wolf, Stanley, *Silicon Processing for the VLSI ERA*, vol. 2, pp. 247–251, 1990.

Primary Examiner—Charles Bowers
Assistant Examiner—Matthew Whipple
Attorney, Agent, or Firm—Oblon, Spivak, McClelland, Maier & Neustadt, P.C.

[57] ABSTRACT

A wafer having a recess with an aspect ratio of 0.5 or above on a surface to be processed is placed on a holder provided within a process chamber. A process gas consisting of a mixture of a material gas of $SiH_4$ and a carrier gas of $H_2$ is uniformly supplied to the surface of the wafer vertically. The pressure within the process chamber is set at 1 Torr or above. The temperature of the surface to be processed of the wafer is set at 600° C. to 800° C. Under these conditions, a polysilicon film is formed in the recess by a vapor phase growth method. During the formation of the film, the wafer is rotated at 500 rpm or above by an output of a motor via a holder. Thereby, a high film formation rate and a good step coverage can be made compatible.

17 Claims, 5 Drawing Sheets

METHOD OF FORMING A FILM IN RECESS BY VAPOR PHASE GROWTH

BACKGROUND OF THE INVENTION

1. Field of the Invention

The present invention relates to a method of forming a film in a semiconductor manufacturing process, and more particularly to a method of forming a film of a semiconductor, a conductor, an insulator, etc. in a recess present on a surface of a substrate to be treated by using a vapor phase growth method.

2. Description of the Related Art

There are several methods of forming a film on a surface of a substrate to be processed. One of them is a vapor phase growth method. In the vapor phase growth method, a chemical reaction of material gas at high temperatures is utilized. Although the reaction at high temperatures is disadvantageous, this method is advantageous in that various kinds of films can be obtained with high adhesion strength and the control of film thickness is relatively easy. As an apparatus for actually forming a film on the surface of the substrate to be processed, a batch-type low pressure CVD (LPCVD) apparatus, etc. have been widely used. In the batch-type low pressure CVD apparatus, films are simultaneously formed on surfaces to be processed of a plurality of substrates.

In the field of manufacture of semiconductor devices, however, the diameter of a wafer or a substrate to be processed has recently been increased more and more. In the batch-type LPCVD apparatus, it is, therefore, difficult to keep in-plane uniformity of a film formed on a wafer or uniformity among films formed on wafers. Under the circumstances, in the field of manufacture of semiconductor devices, there is a tendency that a multi-chamber apparatus for forming films on wafers one by one is widely used.

In the multi-chamber apparatus, in order to increase the through-put, it is necessary to increase the film formation rate. If the temperature of the surface to be processed of the wafer, i.e. the film formation temperature, is raised, the film formation rate can be increased. However, if the film formation temperature is raised, there occurs a problem in that a step coverage or burying properties on fine recesses present on the wafer will deteriorate.

In the manufacturing process of semiconductor devices, there are many cases where buried layers are formed in the recesses present on the surface to be processed of the wafer or thin films are formed along inner walls of the recesses. For example, in the manufacturing process of memories, it is necessary to perform a step of filling vertical or horizontal recesses with an electrode material, e.g. polysilicon. In addition, in many cases, buried layers or thin films are formed in groove-like recesses between wires or recesses such as via holes or through-holes. If the film formation temperature is raised, films are preferentially grown at the entrances of these recesses. Consequently, the films will have a so-called overhanging shape, or the films will close the entrances of the recesses and voids will form in the recesses.

As stated above, in the conventional film forming method using the gas phase growth method, the high-rate film formation is not compatible with a good step coverage. In other words, in the conventional film forming method, it is difficult to form a film of a uniform thickness at a high rate or to form a void-free buried layer.

SUMMARY OF THE INVENTION

The present invention has been made in consideration of the above problems of the prior art, and its object is to provide a method of forming a film in a recess by vapor phase growth, wherein both characteristics of a film formation rate and a step coverage, which are incompatible, are improved at the same time.

According to a first aspect of the present invention, there is provided a method of forming a film in a recess on a surface to be processed of a substrate, the method comprising the steps of:

placing the substrate on a support member such that the surface to be processed is exposed within a process space of a container;

forming the film in the recess by vapor phase growth, while supplying a process gas into the process space, exhausting the process space and heating the surface to be processed, the process gas containing a material gas for providing a material of the film by a vapor phase reaction and a surface reaction; and rotating the substrate at 500 rpm or above during the formation of the film.

According to a second aspect of the invention, there is provided a method of forming a film in a recess on a surface to be processed of a substrate, the method comprising the steps of:

placing the substrate on a support member such that the surface to be processed is exposed within a process space of a container;

forming the film in the recess by vapor phase growth, while supplying a process gas into the process space, exhausting the process space and heating the surface to be processed, the process gas containing a material gas for providing a material of the film by a vapor phase reaction and a surface reaction; and rotating the substrate during the formation of the film, in a plane substantially parallel to the surface to be processed, wherein a pressure within the process space is set such that a flow of the process gas forms a viscous flow region, a temperature of the surface to be processed is set at a degree higher than a thermal decomposition temperature of the material gas, and a rotational speed of the substrate is set such that the thickness of a thermal boundary layer formed on the surface to be processed within the process space decreases by rotation of the substrate and the material gas reaches at least an entrance portion of the recess in the state in which the material gas is not substantially thermally decomposed.

Preferable modes of the methods according to the above first and second aspects are as follows:

(1) An aspect ratio D/W of the recess is greater than 0.5 in the case where a minimum width W of an entrance portion of the recess is 3 $\mu$m or less and the depth of the recess is D.

(2) The pressure within the process space is set at $10^{-3}$ Torr or above.

(3) The rotational speed of the substrate increases in accordance with an increase in the aspect ratio of the recess.

(4) The process gas consists of a mixture of the material gas and a carrier gas, and the carrier gas is formed of a material which is produced by thermal decomposition of the material gas and does not provide the material of the film. For example, the material gas consists of silicon hydride and the carrier gas consists of hydrogen.

The thermal decomposition reaction of the material gas occurs mainly in a thermally boundary layer adjoining the surface to be processed. Since the substrate to be processed is rotated in the present invention, the gas near the surface to be processed can be sent out by centrifugal force and the thickness of the thermal boundary layer can be controlled by the rotational speed of the substrate. The higher the rotational speed, the less the thickness of the thermal boundary layer. Thus, the decomposition reaction amount of the material gas can be reduced, and the contribution of a very active reaction intermediate product to the film formation can be reduced. As a result, a good step coverage can be obtained. Therefore, a good step coverage and burying properties can be obtained under the conditions of an aspect ratio (AR) of AR>0.5 and a Knudsen number Kn<0.001, where such a good step coverage and burying properties have been difficult to obtain in the prior art.

DETAILED DESCRIPTION OF THE PREFERRED EMBODIMENT

An embodiment of the present invention will now be described reference to the accompanying drawings.

Figure 1:
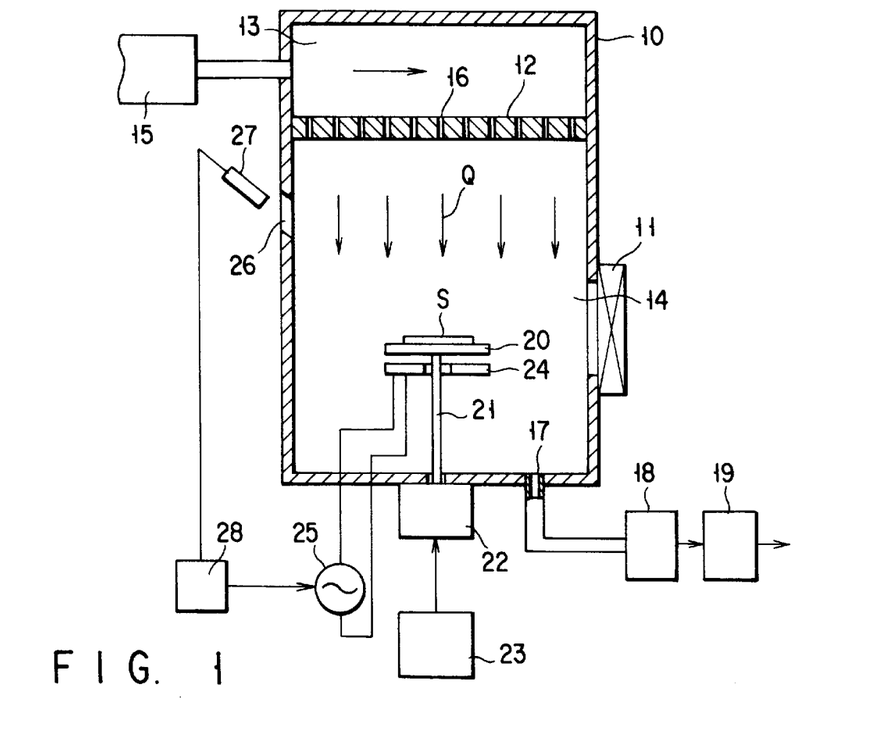
FIG. 1 schematically shows an example of a CVD apparatus for working a method according to the present invention.

FIG. 1 shows a CVD (Chemical Vapor Deposition) apparatus for working a method of the present invention.

An opening for loading and unloading a wafer S or a substrate to be processed is formed in a side wall of a sealed container 10 of the CVD apparatus. The opening is opened and closed by a gate 11. A rectifying plate 12 is situated within the container 10 for dividing the inside of the container 10 into an upper part and a lower part. A rectifying chamber 13 is formed above the rectifying plate 12, and a process chamber 14 is formed below the rectifying plate 12.

The rectifying chamber 13 is connected to a gas supply system 15 for supplying a process gas produced by mixing a material gas such as $SiH_4$ and a carrier gas such as $H_2$. The process gas supplied from the gas supply system 15 is supplied from the rectifying chamber 13 into the process chamber 14 via a plurality of diffusion holes formed in the rectifying plate 12 with uniform distribution. The process gas flows into the process chamber 14 in a direction perpendicular to the rectifying plate 12, and flows towards the wafer S in the form of gas streams Q with a uniform flow rate distribution.

An exhaust port 17 connected to an exhaust system 19 via a filter 18 is formed in a bottom portion of the process chamber 14. The pressure (process pressure) within the process chamber 14 is maintained at a predetermined value by balancing the supply amount of the process gas from the gas supply system 15 and the exhaust amount of gas by the exhaust system 19. The filter 18 functions to capture particles produced within the process chamber 14, and may be replaced with a cyclone or a cold trap.

Figure 2A:
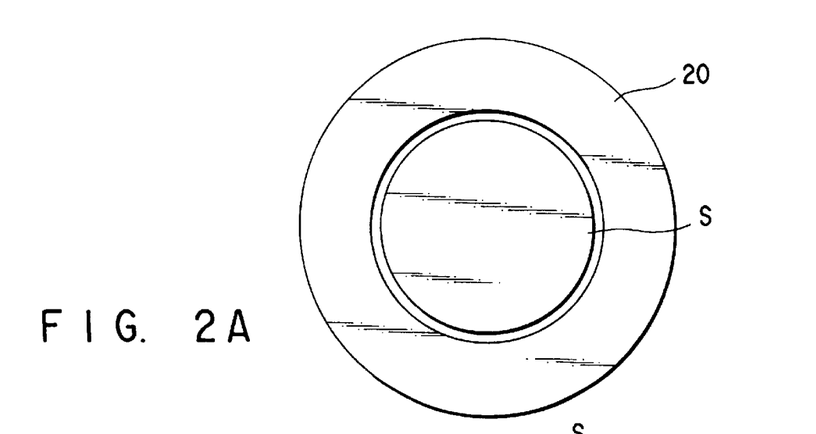
FIGS. 2A and 2B are a plan view and a vertical cross-sectional side view of a wafer holder in the apparatus shown in FIG. 1.
Figure 2B:
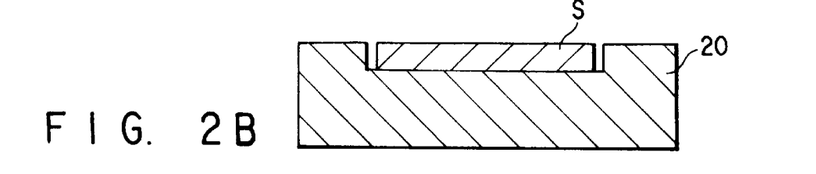

A holder 20 for holding the wafer S, as shown in FIGS. 2A and 2B, is situated within the process chamber 14 so as to face the rectifying plate 12 at a position where a substantially uniform gas flow rate distribution is obtained. The diameter of the holder 20 may be increased so as to hold a plurality of wafers S. The wafer S may be held on the holder by means of a clamp or an electrostatic chuck. One end portion of a shaft 21 is coaxially connected to a central portion of the lower surface of the holder 20. The other end portion of the shaft 21 penetrates a bottom wall portion of the process chamber 14 airtightly and rotatably and is connected to a rotational shaft of a motor 22 provided outside the container 10. An input terminal of the motor 22 is connected to an output-variable motor power supply 23. The motor 22 may not be airtightly separated from the process chamber 14.

A heater 24 for heating the wafer S through the holder 20 is situated to face the lower surface of the holder 20. An input terminal of the heater 24 is connected to an output variable AC power supply 25 provided outside the container 10.

On the other hand, a light transmission window 26 for transmitting light is formed in part of a side wall of the process chamber 14. A radiation thermometer 27 is situated outside the transmission window 26 at a position facing the wafer S held on the holder 20. An output from the radiation thermometer 27 is delivered to a temperature controller 28. The temperature controller 28 compares an actual wafer temperature obtained by the radiation thermometer 27 with a target temperature and controls the output of the power supply 25 so as to make the wafer temperature equal to the target temperature. It is possible to situate the radiation thermometer 27 above the container 10 and provide the rectifying plate 12 and the top plate of the container 10 with transmission windows. It is also possible to perform the temperature monitor and control by a means using a thermocouple, etc., and not by the radiation thermometer.

The substrate to be processed in the method of the present invention will now be described.

Figure 10A:
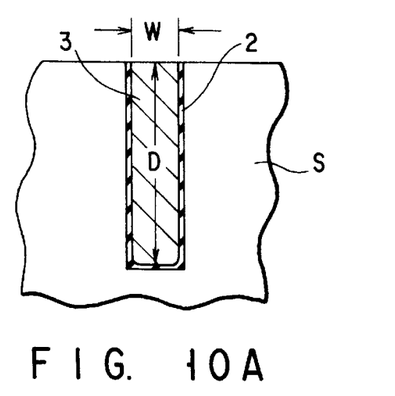
FIGS. 10A and 10B show a trench-type recess and a problem in the film formation.
Figure 11A:
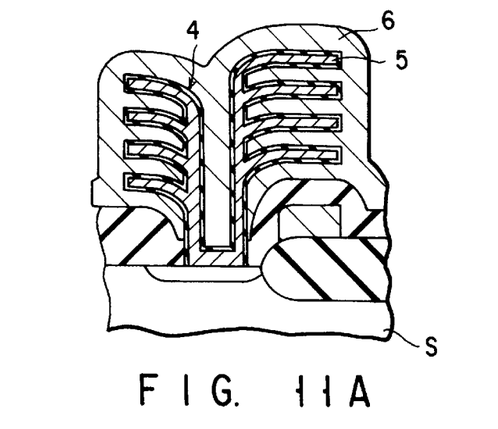
FIGS. 11A and 11B show a stack-type recess and a problem in the film formation.
Figure 12A:
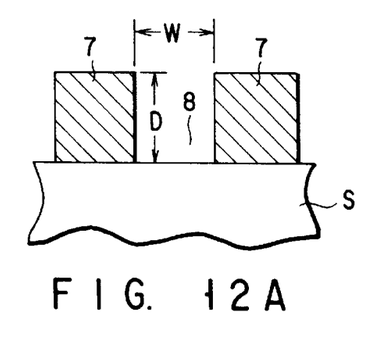
FIGS. 12A and 12B show a recess between wiring elements and a problem in the film formation.

In the processes of manufacturing semiconductor devices, it is often necessary to form buried layers in recesses present in a surface to be processed of a wafer or to form thin films along inner walls of the recesses. For example, in a trench-type memory, as shown in FIG. 10A, an electrode 3 for a capacitor is provided within a trench 2 formed in a wafer S. A stack-type memory has a number of fins 5, as shown in FIG. 11A, and an electrode 6 for a capacitor is provided so as to cover a stack 4 erected on the wafer S. In the processes of manufacturing these memories, it is necessary to fill the trench 2 or a vertical recess, a central hole of the stack 4, or a gap between fins 5 or horizontal recesses, with an electrode material, e.g. polysilicon. In particular, in the semiconductor memory, the width w of the recess is about 1 μm or less and the aspect ratio AR (=D/W) defined by the width W and depth D exceeds 0.5 in many cases. In addition, in many cases, buried layers or thin films are formed in groove-like recesses 8 formed between wiring elements 7 provided on the wafer S, as shown in FIG. 12A, or in recesses such as via holes or through-holes.

A reaction of a material gas in the vapor phase growth method occurs principally within a thermal boundary layer put in contact with a surface to be processed. If the film formation temperature is raised, the material gas tends to easily cause a vapor phase reaction such as a decomposing reaction within the temperature boundary layer. By this decomposing reaction, a very active reaction intermediate product is produced in many cases.

If a mean free path of film formation species in a vapor phase is λ, a Knudsen number Kn is given by $$Kn = \lambda/W$$

Figure 10B:
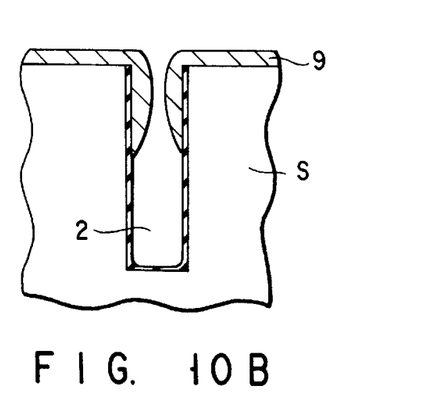
Figure 11B:
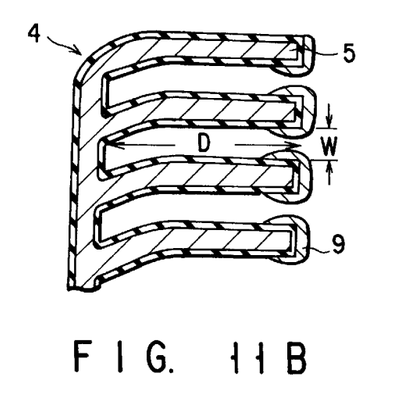
Figure 12B:
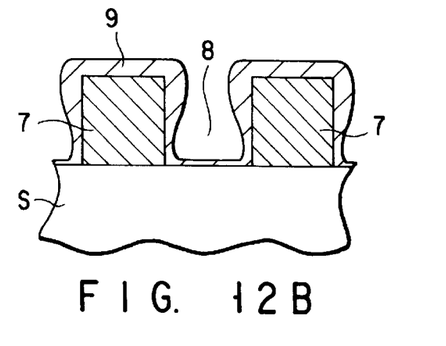

If Kn exceeds 0.001, diffusion of the film formation species within the recess occurs mainly by collision with a surface or a wall of the recess. For example, the mean free path of $SiH_4$ at 700° C. at 38 Torr is estimated to be about 3.6 μm. If a trench having a diameter of 0.5 μm is considered, Kn=7.2 and it is considered that diffusion within the trench occurs by collision with the wall thereof. In this region, if the aforementioned very active reaction intermediate product collides with the wall once or several times, it becomes a solid body in many cases and the intermediate product does not easily diffuse to the deeper part of the recess, i.e. to the bottom part. Specifically, if the highly reactive intermediate product is provided by the material gas, a greater quantity of film is deposited at the entrance portion than the deeper portion of the recess. Thus, as shown in FIGS. 10B, 11B and 12B, the thickness of the film increases at the entrance portion of the recess during film growth, and a so-called overhang film 9 is formed.

Accordingly, in the conventional film forming method using the vapor-phase deposition, if the film formation temperature is raised in order to increase the through-put, the step coverage decreases in the case of a recess of AR>0.5 or under the film formation condition that Kn>0.001. Thus, a high film formation rate and a good step coverage will not be compatible. Specifically, in the case where a film is formed on the surface to be processed, which has a recess with an aspect ratio AR of about 0.5 or above, if a highly reactive gas (intermediate product) is present, the step coverage defined by the ratio (FT2/FT1) of the film thickness FT2 at the bottom portion of the recess to the film thickness FT1 at the entrance portion or peripheral portion of the recess is less than 1. If the step coverage decreases, a void forms in the buried layer provided within the recess, or the film thickness of the wiring provided in the through-hole or via hole becomes non-uniform. As a result, the reliability of the device deteriorates.

The method of the present invention aims at growing a layer in a fine recess having a width of 3 μm or less and an aspect ratio of 0.5 or more. For example, in a 4M-DRAM having a three-dimensionally formed capacitor, it is necessary to form a buried layer in a recess having a maximum width of about 2.5 μm and a minimum width of about 0.8 μm. In the method of the present invention, the CVD apparatus having the above structure is used, and a film is formed by vapor-phase growth, while rotating a substrate to be processed, i.e. a wafer S, having a recess in a surface to be processed. Thereby, the characteristics of both the film formation rate and step coverage are enhanced, and a film with a uniform film thickness can be formed within the recess at a high rate. An example of the procedure for working the method of the present invention will be described below.

At first, a carrier gas is supplied into the process chamber 14 or the process space, and the process chamber 14 is evacuated and maintained at a predetermined constant pressure. The gate 11 is opened in this state, and the wafer S is transferred onto the holder 20 so that the surface to be processed of the wafer S is exposed within the process chamber 14 or process space of the container 10. At this time, a chamber, e.g. a load lock chamber, connected to the process chamber 14 via the gate 11 has been kept at a substantially equal pressure to the pressure in the process chamber 14. At the same time, the wafer S is heated and maintained at a predetermined temperature. While the wafer S is being rotated at a predetermined rotational speed, a material gas is supplied and a film is formed in the recess on the surface to be processed by the vapor phase growth method. The process gas consists of a material gas providing a material of the film by thermal decomposition, or a mixture of a material gas and a carrier gas.

During the film formation, the wafer S is being rotated in a plane substantially parallel to the surface to be processed. The pressure within the process chamber 14 is set at $10^{-3}$ Torr or above, preferably 1 Torr or above, so that the flow of the process gas forms a viscous flow region. The temperature of the surface to be processed of the wafer S is set to be higher than the thermal decomposition temperature of the material gas. The rotational speed of the wafer S is set so that the thickness of the thermal boundary layer formed on the surface to be processed within the process chamber 14 may decrease by the rotation of the wafer S and the material gas may reach at least the entrance of the recess in the state in which the material gas is not decomposed.

If the film is formed under the above conditions, since the gas near the surface of the wafer S can be sent out by a centrifugal force, the thickness of the boundary layer can be reduced. Thus, the decomposition reaction of the material gas, which has not yet reached the entrance of the recess, can be controlled, and it is possible to reduce the contribution of the very active reaction intermediate product to the film formation at the entrance of the recess. Accordingly, even if the film is formed at a high rate, the film with uniform thickness can be formed in the recess. The formation of an overhanging film or a void in the buried layer in the recess can be prevented.

For example, in the case where the wafer S is a silicon wafer and a trench formed in the surface to be processed is filled with a polysilicon buried layer, the desirable conditions are as follows. A process gas for use is a mixture of a material gas of $SiH_4$ and a carrier gas of $H_2$. The pressure within the process chamber 14 is set at 1 Torr or above, e.g. several-ten Torr by balancing the gas supply system and gas exhaust system. The input to the heater 24 is controlled and the temperature of the wafer S is set at 600° C. or above, e.g. 700° C. In addition, the input to the motor 22 is set such that the rotational speed of the holder 20 is set at a value higher than 0.1 $U^2/v$, e.g. at 3000 rpm, when the flow rate of the gas flow Q supplied uniformly to the wafer S is U and the viscosity of the gas is v. In the case where the gas flow is present, even if the wafer is not rotated, the boundary layer has a certain thickness. By setting the rotational speed at a value higher than 0.1 $U^2/v$, the thickness of the boundary layer can be made less than in the case where the wafer is not rotated.

A description will now given of the factors for determining the conditions in the method of the present invention. In this case, $SiH_4$ is used as material gas, a polysilicon film is grown by vapor-phase growth, and the polysilicon film is buried in the trench.

In the vapor phase growth method, $SiH_4$ is considered to cause the following vapor phase reaction in a vapor phase:

$SiH_4 \leftarrow\rightarrow SiH_2 + H_2$ \hfill (1)

An Si solid is formed by $SiH_4$ and $SiH_2$ in a surface reaction. Of the molecules colliding with the surface of the solid, the ratio of those becoming a film is defined as sticking probability. The sticking probability of $SiH_4$ at 700° C. is about $1 \times 10^{-5}$. In other words, if 100,000 molecules of $SiH_4$ collide with the surface, only one of them becomes a film. The reactivity is so low. Since $SiH_4$ is a molecule of so low reactivity, $SiH_4$ gas is present to a bottom portion of a deep trench of an aspect ratio of 9, with substantially equal concentration at the entrance and bottom portions of the deep trench. Accordingly, the film is formed with the same thickness from the entrance and peripheral portions of the trench to the bottom portion of the trench, and the value of step coverage is 1.

On the other hand, the adhesion probability of $SiH_2$ is considered to be about 1. In other words, almost all $SiH_2$ colliding with the surface becomes a film at that place. Thus, in the case of a deep trench with an aspect ratio of 9, $SiH_2$ becomes a film only at the entrance of the trench and does not substantially reach the bottom of the trench. In the case of a shallow trench of an aspect ratio of 0.5, too, a film is not formed uniformly within the trench.

The decomposing reaction in the vapor phase of $SiH_4$ gas begins at several hundred °C. or above. The higher the temperature, the higher the decomposition rate. There are some reports on the decomposing reaction rate. Since the adhesion probabilities of $SiH_4$ and $SiH_2$ differ 100,000 times, if a very little quantity of $SiH_2$ occurs in the decomposing reaction, it will become a cause of deterioration of step coverage. For example, even if a little quantity of $SiH_4$ is decomposed and $SiH_2$ is produced only in an amount of $1 \times 10^{-5}$ of the concentration of $SiH_4$, the contribution ratio of each of $SiH_4$ and $SiH_2$ to the film formation on the surface to be processed is 50%. However, since $SiH_2$ cannot reach the bottom of the trench with an aspect ratio of 9, the film formation at the bottom of the trench is performed substantially with $SiH_4$ alone. Since the concentration of $SiH_4$ is substantially equal at the bottom of the trench, too, the film thickness at the bottom of the trench is substantially half that at each of the entrance and peripheral portions. Accordingly, the value of the step coverage is about 0.5.

Thus, in order to improve the step coverage, it suffices if the generation of highly reactive $SiH_2$ is curbed. If the temperature of the surface to be processed is decreased in order to curb the generation of $SiH_2$, the film formation rate will decrease. Therefore, the through-put will deteriorate, and the film formation cost will rise. Specifically, it is necessary to substantially maintain the film formation rate, while curbing the generation of $SiH_2$.

From the above standpoint, the research of the present invention was conducted and it has been found that rotating the substrate to be processed is effective, as described above. If the substrate to be processed is rotated, the process gas (material gas and carrier gas) on the substrate is sent out in a lateral direction by centrifugal force, and the thermal boundary layer and concentration boundary layer formed on the substrate become thinner. This effect is conspicuous, in particular, in an apparatus of the type wherein the process gas is uniformly supplied vertically to the surface to be processed of the substrate.

It is known that the order of thickness δ of a boundary layer of a flow caused by a rotational disk in a static fluid is generally given by formula (2) below. The thickness of the thermal boundary layer is about 4δ. The time constant τ necessary for diffusion of the material gas in the boundary layer is generally given by formula (3) below. In the following formulae, symbol v represents the dynamic viscosity of gas, symbol ω represents the rotational speed, and symbol Cd represents the diffusion coefficient. Specifically, the higher the rotational speed of the substrate, the lower the time constant τ. Formula (3) indicates that since the time constant τ of diffusion relates to the time needed for the decomposing reaction of the material gas, the decomposing reaction of the material gas is curbed in accordance with an increase in rotational speed if a flow in the process chamber closes to the flow caused by the rotational disk in the static fluid.

$$\delta = (v/\omega)^{1/2} \hfill (2)$$

$$\tau = (\delta^2/Cd)^{1/2} \, 1/\omega \hfill (3)$$

Figure 3:
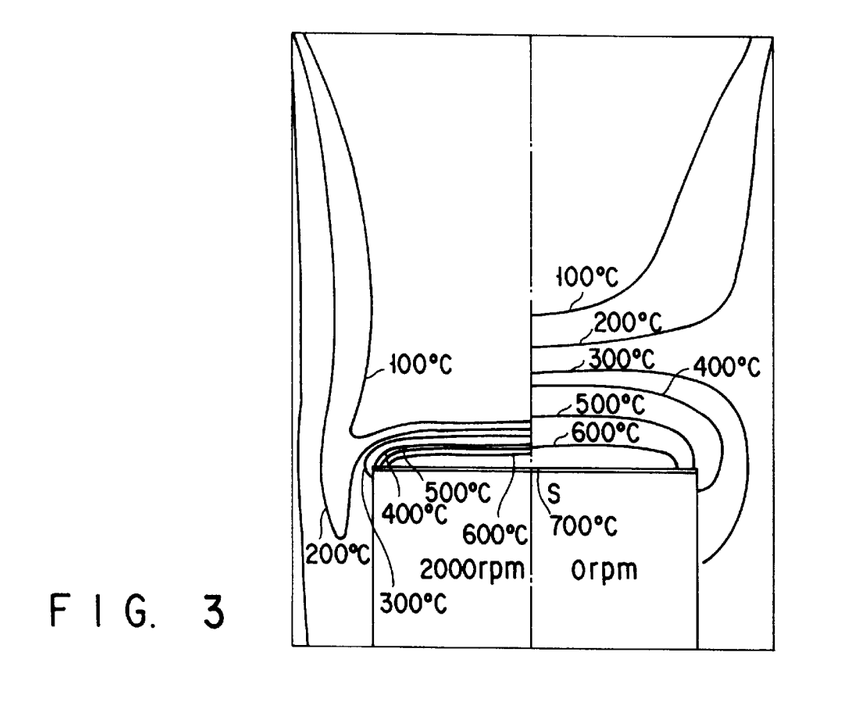
FIG. 3 shows a difference in state of a thermal boundary layer between the case where a wafer is not rotated and the case where a wafer is rotated.
Figure 4:
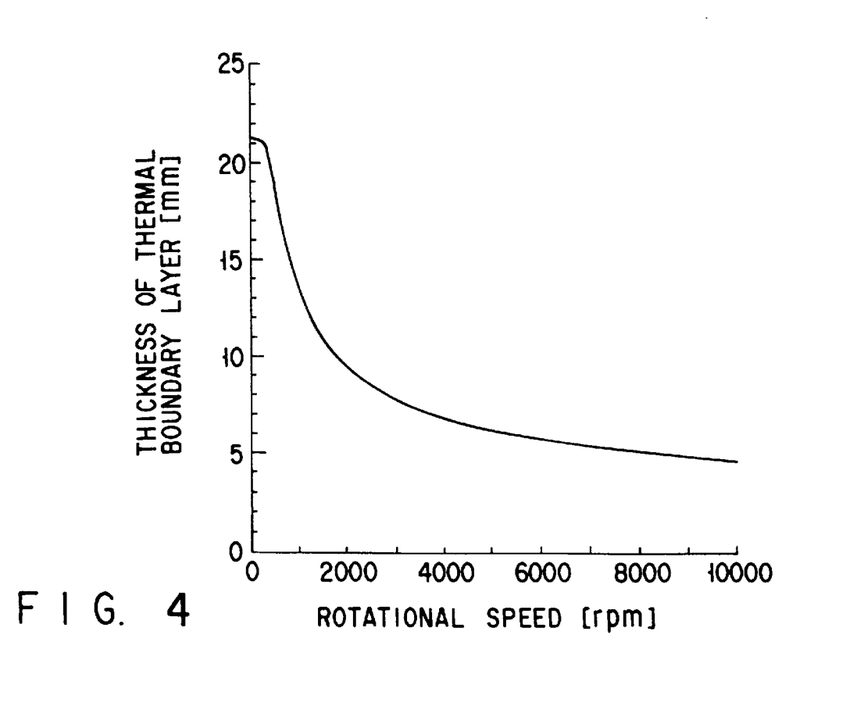
FIG. 4 is a graph showing the relationship between the rotational speed of the wafer and thickness of the thermal boundary layer.

Specifically, in the apparatus shown in FIG. 1, the thickness of the thermal boundary layer can be reduced by rotating the substrate. FIG. 3 shows simulation results of the thermal boundary layer between the case where the wafer was not rotated and the case where the wafer was rotated at 2000 rpm, under the conditions: the temperature of the surface to be processed of the wafer was 700° C.; the pressure within the process chamber 14 was 152 Torr; and the flow rates of process gases $SiH_4$ and $H_2$ were 1 SLM and 15 SLM, respectively. It is understood that in the case where a layer defined on the wafer by an isothermal line of 300° C. was supposed to be a thermal boundary layer, the thickness of the thermal boundary layer was reduced to about ⅓ when the wafer was rotated at 2000 rpm, as compared to the case where the wafer was not rotated. FIG. 4 shows the relationship between the rotational speed of the wafer and the thickness of the thermal boundary layer under the same conditions, by visualizing the flow. From this figure, it is understood that the effect of thinning the thermal boundary layer was obtained at a rotational speed of 500 rpm or more.

Accordingly, by rotating the wafer at a rotational speed more than a predetermined value, it is possible to curb the reaction by which the material gas of $SiH_4$ is decomposed into $SiH_2$ before reaching the surface to be processed of the substrate. Thereby, the step coverage does not decrease even if the process temperature of the substrate is raised and the film formation rate is increased. In other words, according to the present invention, the high film formation rate and good step coverage can be made compatible, unlike the conventional method.

Figure 5:
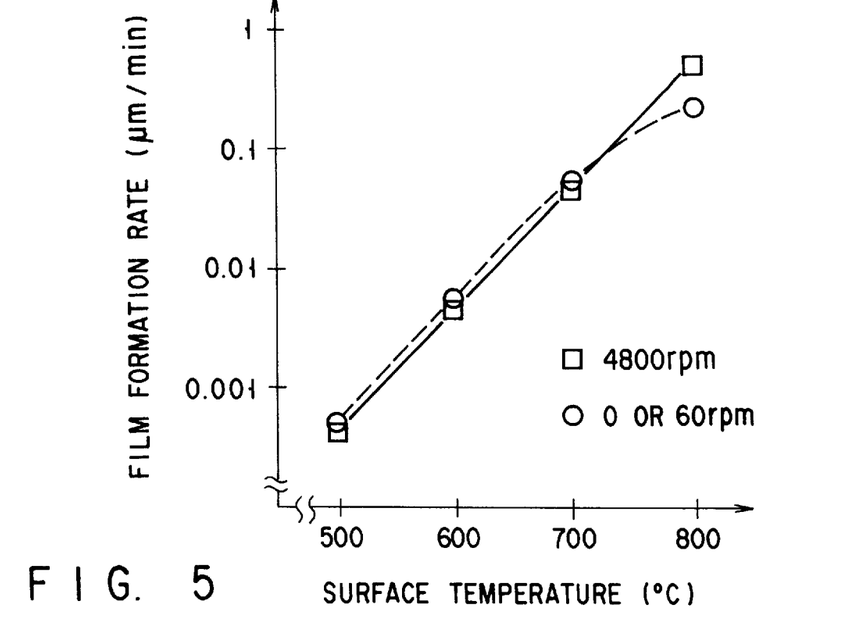
FIG. 5 is a graph showing the relationship between the temperature of the surface to be processed and the film formation rate in the method of the present invention and a conventional method.
Figure 6:
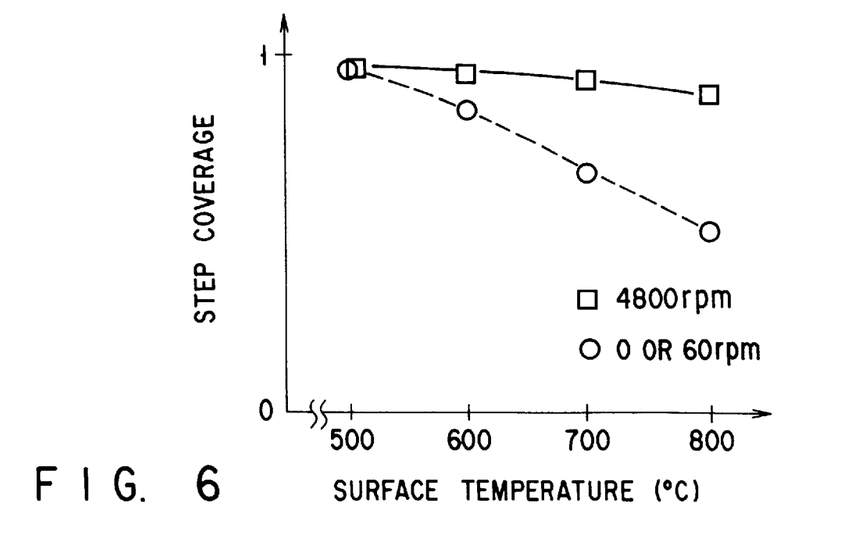
FIG. 6 is a graph showing the relationship between the temperature of the surface to be processed and the step coverage in the method of the present invention and the conventional method.

FIG. 5 shows experimental results on the relationship between the temperature of the surface to be processed and the film formation rate. In the experiments, the following conditions were set: the rotational speed of the wafer or the substrate to be processed was 0 rpm, 60 rpm or 4800 rpm; the pressure within the process chamber 14 was 38 Torr; and the flow rates of process gases $SiH_4$ and $H_2$ were 1 SLM and 15 SLM, respectively. FIG. 6 shows experimental results on the temperature-dependency of the step coverage. In the experiments in FIG. 6, a wafer having a trench with an aspect ratio of 9 on the surface to be processed was used, and the same conditions as in FIG. 5 were adopted. As mentioned above, the step coverage was defined by the ratio (FT2/FT1) of the film thickness FT2 at the bottom portion of the recess to the film thickness FT1 at the entrance portion or peripheral portion of the recess.

From the experiments in FIGS. 5 and 6, each time the temperature of the surface to be processed rose, in the order of 500° C., 600° C., 700° C. and 800° C., it was found that the film formation rate increased about ten times. At 500° C., there is no substantial difference in film formation rate and step coverage between the case where the wafer was rotated and the case where the wafer was not rotated. The reason for this appears to be that $SiH_4$ is little decomposed at 500° C. in the vapor phase.

When the rotational speed of the wafer was 0 rpm or 60 rpm, the film formation rate increased in accordance with a rise in temperature of the surface to be processed but the step coverage deteriorated. By contrast, when the rotational speed of the wafer was 4800 rpm, the film formation rate increased in accordance with a rise in temperature of the surface to be processed, while the step coverage did not greatly vary and remained at a good value. The reason for this appears to be that the process gas near the surface of the wafer was sent out by centrifugal force, as mentioned above, and thereby the thickness of the thermal boundary layer reduced adequately.

Figure 7:
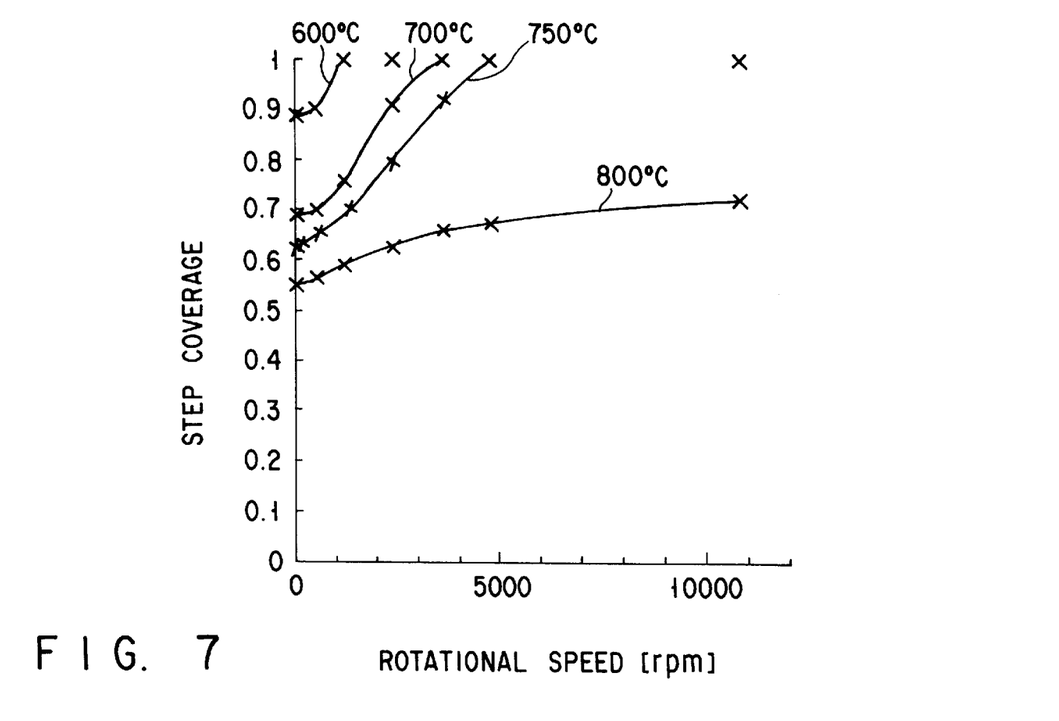
FIG. 7 is a graph showing the relationship between the rotational speed of the wafer and the step coverage at different temperatures of the surface to be processed.

FIG. 7 shows experimental results on the relationship between the rotational speed of the substrate to be processed and the step coverage. In the experiments, a wafer having a trench with an aspect ratio of 9 on the surface to be processed was used, and the following conditions were set: the temperature of the surface to be processed of the wafer was 600° C., 700° C. or 800° C.; the pressure within the process chamber 14 was 152 Torr; and the flow rates of process gases $SiH_4$ and $H_2$ were 1 SLM and 15 SLM, respectively.

The average film formation rate at 700° C. was about 540 nm. This rate was several tens of times the film formation rate, i.e. about 10 nm, of a general batch-type LPCVD apparatus. As is shown in FIG. 7, at 700° C., the values of step coverage in the cases where the rotational speeds of the wafer were 0 rpm and 3600 rpm or more were 0.69 and 1, respectively. As was described in connection with FIG. 5, the film formation rate at 700° C. was about ten times the film formation rate at 600° C. By rotating the substrate in this manner, the high film formation rate and good step coverage were made compatible.

At 800° C., the reactivity of $SiH_4$ itself further increases. As was described in connection with FIG. 5, the film formation rate at 800° C. was about ten times the film formation rate at 700° C. At 800° C., the values of step coverage in the cases where the rotational speeds of the wafer were 0 rpm and 2400 rpm or more were 0.55 and 0.63, respectively. As is shown in the figure, it was found that the film formation rate was increased and the step coverage was improved by raising the temperature of the surface to be processed in the range of 600° C. to 800° C., at which the experiments were conducted, and by rotating the wafer.

Figure 8:
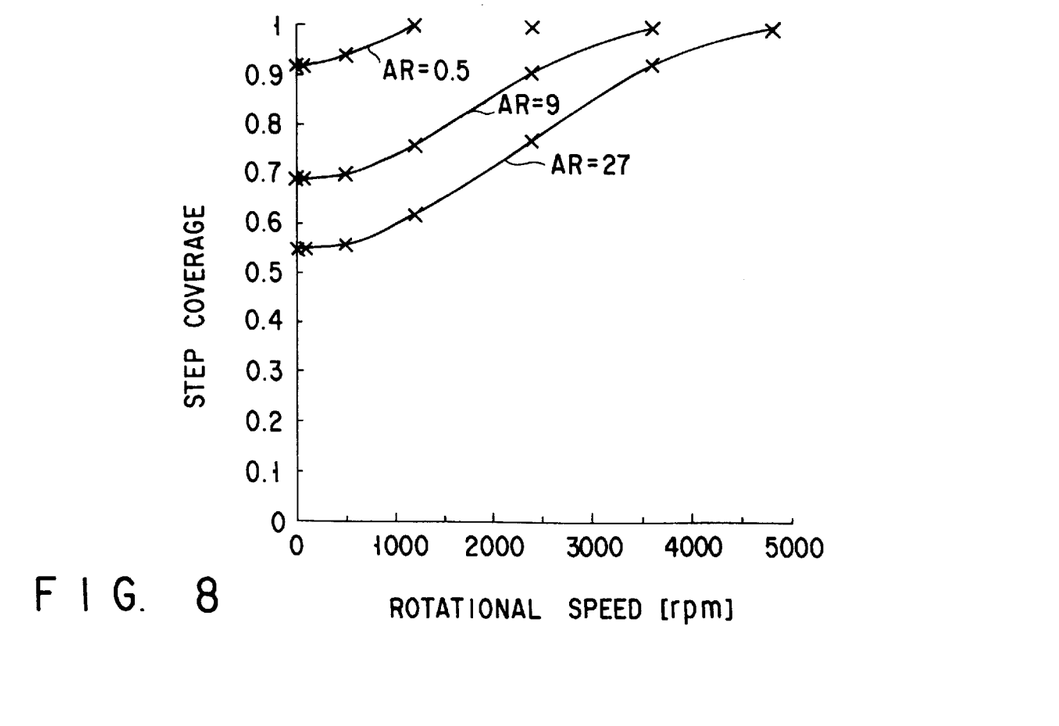
FIG. 8 is a graph showing the relationship between the rotational speed of the wafer and the step coverage at different aspect ratios of recesses.

The value of the step coverage varies, depending not only on the rotational speed of the wafer or the substrate to be processed but also on the aspect ratio (AR) of the recess. FIG. 8 shows experimental results on the relationship between the aspect ratio of the recess and the step coverage.

In the experiments, the following conditions were set: the temperature of the surface to be processed of the wafer was 700° C.; the pressure within the process chamber 14 was 152 Torr; and the flow rates of process gases $SiH_4$ and $H_2$ were 1 SLM and 15 SLM, respectively.

The step coverage was better in accordance with a decrease in aspect ratio, i.e. depth of the trench. However, even with respect to the trench of the aspect ratio of 0.5, the value of the step coverage was less than 1 when the wafer was not rotated. When the rotational speed was increased, the value reached 1. The effect of improvement of the step coverage occurred at the rotational speed of about 500 rpm. The effect of improvement of the step coverage was confirmed with respect to the trench having the aspect ratio of 0.5 or above. In the case of a deeper trench having an aspect ratio of 27, the value of the step coverage reached 1 when the rotational speed was increased up to 4800 rpm.

In the case where the aspect ratio was increased, in particular, where the aspect ratio was increased to 9 or more, the desirable range of the temperature of the surface to be processed was 700° C.±50° C. from the standpoints of both the film formation rate and step coverage. When the temperature of the surface to be processed was less than 650° C., the film assumed an almost amorphous state. Thus, in the heating step after the film formation, the volume of the film was reducing while the amorphous structure was changing into a polysilicon. A small void, which was not present immediately after the film formation, formed within the buried layer. Inversely, when the temperature of the surface to be processed exceeded 750° C., voids called "nests" tended to easily form in a trench of a high aspect ratio in the state in which the film has been formed. The presence of the voids is not preferable in terms of device characteristics.

When any one of hydrogen, nitrogen and argon was used as carrier gas, the step coverage was improved in the aforementioned temperature range of experiments by increasing the rotational speed of the wafer. Where the value of the rotational speed was relatively low, the step coverage was best in the case where the carrier gas was hydrogen ($H_2$). The reason for this appears to be that the reaction from the right to the left in formula (1), in which $SiH_2$ and $H_2$ react into $SiH_4$, tends to easily occur when the carrier gas is $H_2$. Specifically, when $H_2$ is used, the production of $SiH_2$ is relatively curbed, compared to the case where another carrier gas is used, and the step coverage is improved. This merit of using $H_2$ is common to the case where silicon hydride gas is used as material gas.

Furthermore, experiments were conducted with the pressure in the process space, i.e. the pressure within the process chamber 14, varied in the range of 1 to 760 Torr. It was found that there was little variation in step coverage when the rotational speed, the temperature of the surface to be processed, the flow rate of carrier gas and the flow rate of $SiH_4$ were the same. When the pressure within the process chamber 14 was $1 \times 10^{-3}$ Torr or above, the flow of gas forms a viscous flow region and the gas near the surface to be processed can advantageously be sent out by the centrifugal force produced by the rotation of the wafer. Thus, the step coverage can be enhanced.

It was also found that the step coverage was improved by an increase in rotational speed of the wafer, when a gas such as $AsH_3$, $PH_3$, $B_2H_6$, etc. for providing a dopant was contained in the process gas along with the film forming material gas.

Figure 9:
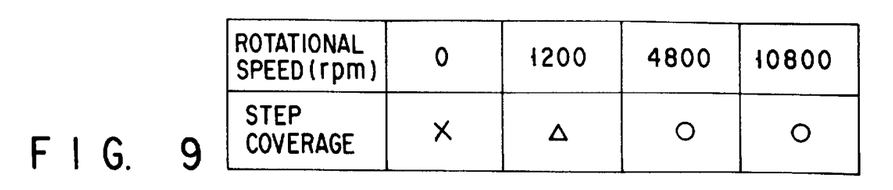
FIG. 9 shows the relationship between the rotational speed of the wafer and burying characteristics.

Further experiments were conducted, in which $Si_2H_6$ was used as material gas and polysilicon films were formed in recesses. In the experiments, a wafer having a trench of an aspect ratio of 10 (diameter: 0.5 µm; depth: 5 µm) in a surface to be processed, as shown in FIGS. 10A and 10B, was used. The following conditions were set: the temperature of the surface to be processed of the wafer was 600° C.; the pressure within the process chamber 14 was 38 Torr; and the flow rate of process gas $Si_2H_6/H_2$ was 0.025/15 SLM. From FIG. 9 showing the experimental results, it is understood that the step coverage was enhanced by rotating the wafer. Similar experiments were conducted at different temperatures of the surface to be processed. It was confirmed that a high film formation rate and a good step coverage were obtained by rotating the wafer and setting the film formation temperature at 500° C. to 800° C.

In each of the above processes, processing is normally performed at a reduced pressure. However, the processing may be performed at a normal pressure. The kind of a film to be formed and a process gas may be different from those used in each of the above processes. The substrate to be processed is not limited to a semiconductor wafer.

As has been described above, according to the present invention, a high film formation rate and a good step coverage can be made compatible, while the vapor phase growth method is adopted.

What is claimed is:

1. A method of forming a film in a recess on a surface of a substrate to be processed, the method comprising the steps of:

placing the substrate on a support member such that the surface to be processed is exposed within a process space of a container, said substrate having a recess with an aspect ratio D/W greater than 0.5 and a minimum width W less than or equal to 3 µm, wherein a depth of the recess is D;

forming the film in the recess by vapor phase growth, while supplying a process gas into the process space, and exhausting the process gas from the process space such that a pressure within the process space is set at $10^{-3}$ Torr or above, and heating the surface to be processed such that a temperature of the surface to be processed is set at a temperature higher than a thermal decomposition temperature of a material gas, said process gas containing said material gas for providing a material of the film by a vapor phase reaction and a surface reaction; and rotating the substrate at a speed of approximately 2400 rpm or above during the formation of the film, in a plane substantially parallel to the surface to be processed, where said speed is selected so as to increase in accordance with an increase in an aspect ratio of the recess, in order to provide a uniform film thickness in the recess.

2. The method according to claim 1, wherein said process gas consists of a mixture of the material gas and a carrier gas.

3. The method according to claim 2, wherein said carrier gas is formed of a material the same as that produced by thermal decomposition of the material gas and does not provide said material of the film.

4. The method according to claim 3, wherein said material gas consists of silicon hydride and said carrier gas consists of hydrogen.

5. The method according to claim 4, wherein said film is formed of a silicon film, and said material gas provides silicon by a vapor phase reaction and a surface reaction.

6. The method according to claim 5, wherein said material gas is $SiH_4$ and the temperature of the surface to be processed is set at 600° C. to 800° C.

7. The method according to claim 5, wherein said material gas is $Si_2H_6$ and the temperature of the surface to be processed is set at 500° C. to 800° C.

8. A method of forming a film in a recess on a surface of a substrate to be processed, the method comprising the steps of:

placing the substrate on a support member such that the surface to be processed is exposed within a process space of a container, said substrate having a recess with an aspect ratio D/W greater than 0.5 and a minimum width W less than or equal to 3 µm, wherein a depth of the recess is D;

forming the film in the recess by vapor phase growth, while supplying a process gas into the process space, exhausting from the process space and heating the surface to be processed, said process gas containing a material gas for providing a material of the film by a vapor phase reaction and a surface reaction; and rotating the substrate at a speed of approximately 2400 rpm or above during the formation of the film, in a plane substantially parallel to the surface to be processed, for providing a uniform film thickness in the recess;

wherein a pressure within the process space is set such that a flow of said process gas forms a viscous flow region, a temperature of the surface to be processed is set at a temperature higher than a thermal decomposition temperature of the material gas, and a rotational speed of the substrate is selected so as to increase in accordance with an increase in an aspect ratio of the recess.

9. The method according to claim 8, wherein the pressure within said process space is set at $10^{-3}$ Torr or above.

10. The method according to claim 8, wherein said process gas consists of a mixture of the material gas and a carrier gas.

11. The method according to claim 10, wherein said carrier gas is formed of a material the same as that produced by thermal decomposition of the material gas and does not provide said material of the film.

12. The method according to claim 11, wherein said material gas consists of silicon hydride and said carrier gas consists of hydrogen.

13. The method according to claim 8, wherein said film is formed of a silicon film, and said material gas provides silicon by a vapor phase reaction and a surface reaction.

14. The method according to claim 13, wherein said material gas is $SiH_4$ and the temperature of the surface to be processed is set at 600° C. to 800° C.

15. The method according to claim 13, wherein said material gas is $Si_2H_6$ and the temperature of the surface to be processed is set at 500° C. to 800° C.

16. A method of forming a film in a recess on a surface of a substrate to be processed, the method comprising the steps of:

placing the substrate on a support member such that the surface to be processed is exposed within a process space of a container, said substrate having a recess with an aspect ratio D/W greater than 0.5 and a minimum width W less than or equal to 3 µm, wherein a depth of the recess is D;

forming the film in the recess by vapor phase growth, while supplying a process gas into the process space, and exhausting the process gas from the process space such that a pressure within the process space is set at $10^{-3}$ Torr or above, and heating the surface to be processed such that a temperature of the surface to be processed is set at a temperature higher than a thermal decomposition temperature of a material gas selected from the group consisting of $SiH_4$ and $Si_2H_6$, said process gas containing said material gas for providing a material of the film by a vapor phase reaction and a surface reaction; and rotating the substrate at a speed of approximately 2400 rpm or above during the formation of the film, in a plane substantially parallel to the surface to be processed, where said speed is selected so as to increase in accordance with an increase in an aspect ratio of the recess, in order to provide a uniform film thickness in the recess.

17. A method of forming a film in a recess on a surface of a substrate to be processed, the method comprising the steps of:

placing the substrate on a support member such that the surface to be processed is exposed within a process space of a container, said substrate having a recess with an aspect ratio D/W greater than 0.5 and a minimum width W less than or equal to 3 μm, wherein a depth of the recess is D;

forming the film in the recess by vapor phase growth, while supplying a process gas into the process space, exhausting from the process space and heating the surface to be processed, said process gas containing a material gas selected from the group consisting of $SiH_4$ and $Si_2H_6$, for providing a material of the film by a vapor phase reaction and a surface reaction; and rotating the substrate at a speed of approximately 2400 rpm or above, during the formation of the film, in a plane substantially parallel to the surface to be processed, for providing a uniform film thickness in the recess;

wherein a pressure within the process space is set such that a flow of said process gas forms a viscous flow region, a temperature of the surface to be processed is set at a temperature higher than a thermal decomposition temperature of the material gas, and a rotational speed of the substrate is selected so as to increase in accordance with an increase in an aspect ratio of the recess.

* * * * *